United States Patent [19]

Matsushita

[11] 3,710,206

[45] Jan. 9, 1973

[54] NEGATIVE IMPEDANCE SEMICONDUCTOR DEVICE WITH MULTIPLE STABLE REGIONS

[75] Inventor: Takeshi Matsushita, Atsugi, Japan

[73] Assignee: Sony Corporation, Tokyo, Japan

[22] Filed: Oct. 1, 1970

[21] Appl. No.: 77,270

[30] Foreign Application Priority Data

Oct. 6, 1969 Japan ................................44/79788

[52] U.S. Cl.................317/235 R, 307/299, 307/324, 317/235 A, 317/235 K, 317/235 AD

[51] Int. Cl...............................................H01l 11/08

[58] Field of Search .......317/235; 307/299, 304, 324

[56] References Cited

UNITED STATES PATENTS

| | | | |
|---|---|---|---|
| 3,081,404 | 3/1963 | Memelink | 317/235 |
| 2,790,037 | 4/1957 | Shockley | 317/235 |
| 3,116,183 | 12/1963 | Pell | 317/235 |

*Primary Examiner*—Jerry D. Craig

*Attorney*—Lewis H. Eslinger, Alvin Sinderbrand and Curtis, Morris & Safford

[57] ABSTRACT

An electrical circuit utilizing a semiconductor device to provide a novel negative impedance characteristic. The semiconductor device has, for example, four independent high impurity concentration regions formed on a semiconductor substrate, two of which regions inject carriers of opposite polarities into said substrate and another two of which regions are applied voltages so that junctions formed between said substrate and themselves are reversely biased to establish the desired negative impedance characteristics.

2 Claims, 12 Drawing Figures

INVENTOR

TAKESHI MATSUSHITA

Lewis H. Eslinger ATTORNEYS

INVENTOR
TAKESHI MATSUSHITA

Lewis H. [signature]
ATTORNEYS

INVENTOR
TAKESHI MATSUSHITA

ATTORNEYS

INVENTOR.
TAKESHI MATSUSHITA

INVENTOR
TAKESHI MATSUSHITA

ATTORNEYS

NEGATIVE IMPEDANCE SEMICONDUCTOR DEVICE WITH MULTIPLE STABLE REGIONS

BACKGROUND OF THE INVENTION

1. Field of the Invention

This invention relates to an electric circuit utilizing a semiconductor device, and more particularly to a new semiconductor circuit which exhibits a novel negative impedance characteristic.

2. Description of the Prior Art

There have heretofore been proposed various semiconductor devices or circuits of negative resistance characteristic such, for example, as an S-shaped one.

SUMMARY OF THE INVENTION

A semiconductor negative resistance circuit of this invention is of a novel construction quite different from conventional circuits and exhibits a novel negative resistance characteristic based upon novel principles of operation. This new negative resistance characteristic is expected to be used widely in unknown fields.

One object of this invention is to provide a new electric circuit which exhibits a novel negative impedance characteristic.

Another object of this invention is to provide a new electric circuit employing a semiconductor device which is of novel construction and performs novel operations for exhibiting negative impedance characteristic.

Other objects, features and advantages of this invention will become apparent from the following description taken in conjunction with the accompanying drawings.

DESCRIPTION OF THE PREFERRED EMBODIMENTS

Figure 1:
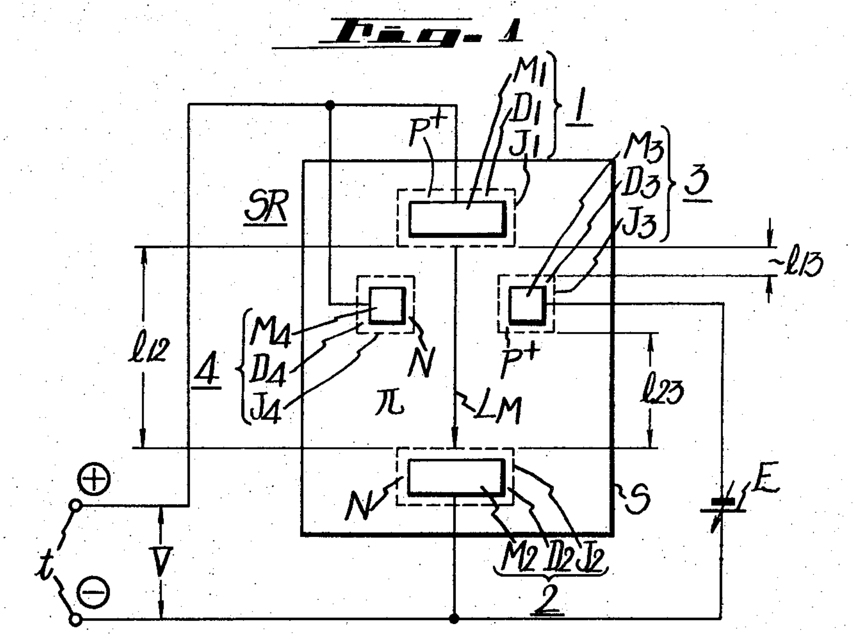
FIG. 1 and 2 are connection diagrams illustrating examples of a negative resistance semiconductor circuit of this invention employing a semiconductor device schematically shown on an enlarged scale.

With reference to the drawings this invention will hereinafter be described in detail. In the drawings reference character SR indicates generally a negative resistance semiconductor circuit.

Figure 2:
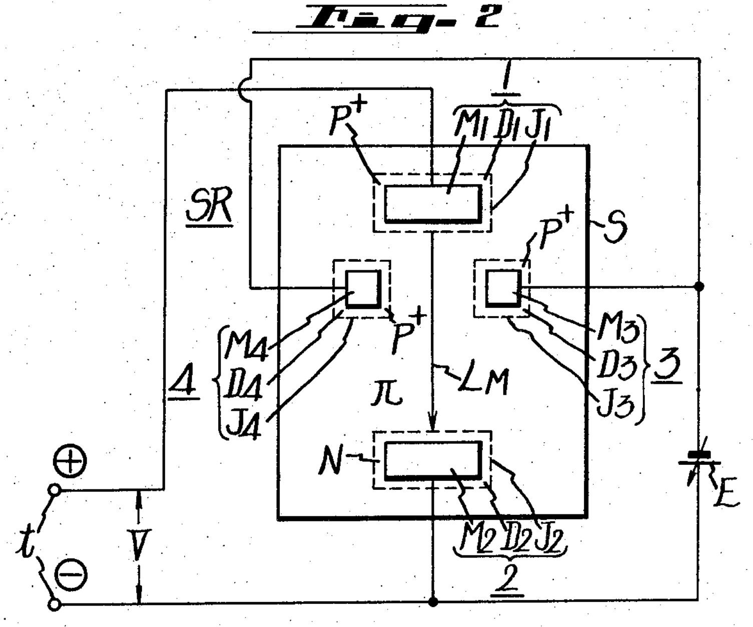

In the present invention first to fourth electrode regions 1 to 4 are formed in a semiconductor substrate S while being exposed at one surface thereof as shown in FIGS. 1 and 2.

The semiconductor substrate S may be formed of silicon, germanium, an intermetallic compound or the like. Further, the semiconductor substrate S is of one conductivity type, for example, $\pi$-type conductivity having an impurity concentration of less than about $10^{15}$ atoms/cm$^3$.

The first electrode region 1 is formed to be capable of efficiently injecting carriers of one polarity, for example, holes into the substrate S. To this end, a P-type impurity region $D_1$, which is of the same conductivity type as that of the substrate S but has an impurity concentration sufficiently higher than the substrate S, is formed, for example, by the diffusion method in a manner to form a P-$\pi$junction $J_1$. An electrode metal layer $M_1$ is deposited on the region $D_1$ in an ohmic manner.

The second electrode region 2 is formed at a place spaced a predetermined distance $l_{12}$ apart from the first electrode region 1 in opposing relation thereto. The second electrode region 2 is formed to be capable of injecting into the substrate S carriers of the opposite polarity to those injected from the first electrode region 1, namely electrons in the present example. An N-type impurity region $D_2$, which is opposite in conductivity type to the semiconductor substrate S and is sufficiently higher in impurity concentration than the substrate S, is formed as the second electrode region 2, for example, by diffusion in a manner to form a $\pi$-N junction $J_2$. An electrode metal layer $M_2$ is deposited on the region $D_2$ in an ohmic manner. It is preferred that the distance $l_{12}$ between the first and second electrode regions 1 and 2 is longer than the diffusion distance of the carriers injected from the both electrode regions 1 and 2.

The third electrode region 3 has a diode junction $J_3$ and is adapted to be capable of effectively collecting the carriers injected from the first or second electrode region 1 or 2 when it is held in the reverse biased condition relative to the substrate S. To this end, the third electrode region 3 is positioned near the first or second electrode region 1 or 2 and the distances $l_{13}$ and $l_{23}$ between the third electrode region 3 and the first and second electrode regions 1 and 2 are selected such that $l_{13} < l_{12}$ and $l_{23} < l_{12}$. Further, the third electrode region 3 is designed so that when it is in the reverse biased condition relative to the substrate S, namely when the junction $J_3$ is in the reverse biased condition, a depletion layer may greatly expand outwardly, namely into the substrate S.

In the examples shown in FIGS. 1 and 2 the third electrode region 3 is used to capture the holes injected from the first electrode region 1, in which case a P-type impurity region $D_3$ having the same conductivity type as that of the region $D_1$ of the first electrode region 1 and having a high impurity concentration is formed by the diffusion or like method to form the P-$\pi$ junction $J_3$ and an electrode metal layer $M_3$ is deposited on the region $D_3$ in an ohmic manner.

The fourth electrode region 4 has a diode junction $J_4$ and is adapted to capture the carriers of the opposite to or the same polarity as that of the carriers collected by the third electrode region 3. For this purpose, an N-type high impurity concentration region $D_4$ is formed by diffusion or the like method as shown in FIG. 1 or a P-type high impurity concentration region $D_4$ of the same conductivity type as that of the region $D_3$ of the third electrode region 3 is formed by diffusion or the like method as depicted in FIG. 2 and an electrode metal layer $M_4$ is deposited on the region $D_4$ in an ohmic manner.

The third and fourth electrode regions 3 and 4 are located on both sides of a current path between the first and second electrode regions 1 and 2. In this case the third and fourth electrode regions 3 and 4 are arranged opposite to each other on both sides of a current path LM (hereinafter referred to as a main current path) having a cross-section of great current density. Both electrode regions 3 and 4 are positioned on a line crossing the current path LM at an angle of about 90° thereto and at places of substantially equal distances from the path LM, namely arranged substantially symmetrical with each other relative to the path LM.

In the event that the fourth electrode region 4 is adapted to capture the carriers of the opposite polarity to those collected by the third electrode region 3, the fourth electrode region 4 is electrically connected to, for example, the first electrode region 1 as illustrated in FIG. 1. On the other hand, when the fourth electrode region 4 is to collect the carriers of the same polarity as those captured by the third electrode region 3, the fourth electrode region 4 is connected to, for example, the third electrode region 3 as depicted in FIG. 2.

Then, terminals *t* are led out from the first and second electrode regions 1 and 2 and a DC control power source E is connected between the third and second electrode regions 3 and 2 in such a manner that the negative electrode of the power source E is connected to the third electrode region 3, by which the third electrode region 3 is put in the reverse biased condition relative to the substrate S.

Figure 3:
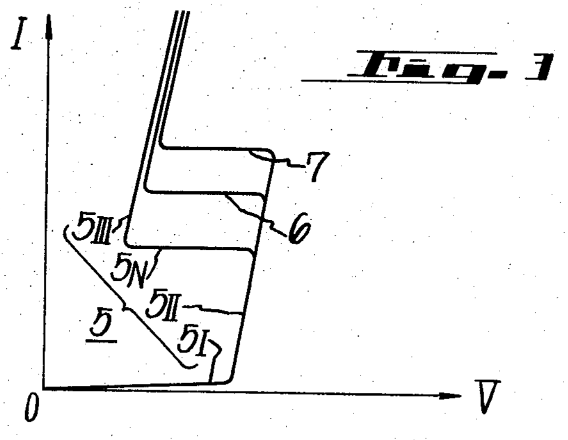
FIG. 3 is a graph showing their voltage-current characteristics.

With such an arrangement, when the voltage $V_G$ of the power source E is selected higher than a certain value and a forward voltage V is impressed between the terminals *t*, namely between the first and second electrode regions 1 and 2 in such a manner that the first electrode region 1 is made positive relative to the second electrode region 2, the voltage V to current I output characteristic of the semiconductor circuit SR is a negative resistance characteristic such as shown in FIG. 3. Thus, the negative resistance semiconductor circuit SR of this invention exhibits the negative resistance characteristic, which is, however, greatly different from that of an existing negative resistance semiconductor device, for example, a thyristor, as will be seen from the characteristic curve of FIG. 3. That is, the characteristic curve of the negative resistance semiconductor circuit SR of this invention includes a first stable region 5I, a second stable region 5II, a negative resistance region 5N and a third stable region 5III and is greatly featured in the prominent existence of the second stable region 5II.

The reason why the negative resistance semiconductor circuit SR of this invention exhibits such an output characteristic as above described can be considered to be caused by the following operation.

Figure 4A:
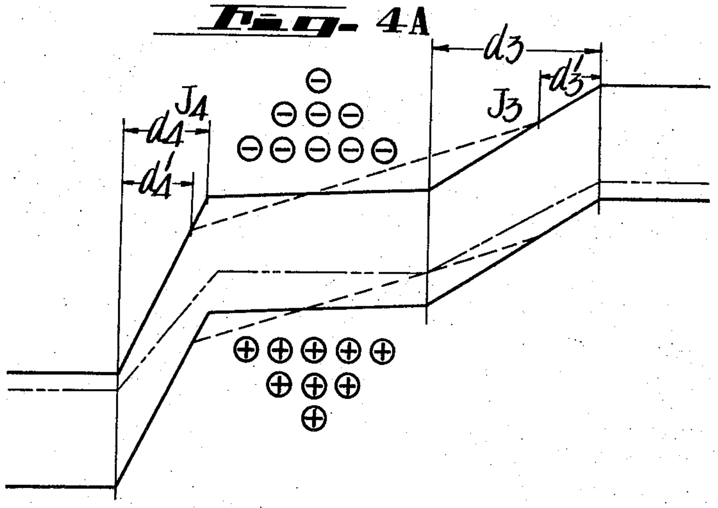
FIG. 4A and 4B are schematic diagrams showing the energy band constructions of the semiconductor devices depicted in FIGS. 1 and 2, for explaining their operations.

The following description will be given of the circuit SR of the construction depicted in FIG. 1. In FIG. 4A there is indicated by solid lines the energy band construction of the substrate S in cross-section along the alignment line of the third and fourth electrode regions 3 and 4 crossing the current path LM between the first and second electrode regions 1 and 2 when a reverse bias voltage is impressed between the second and third electrode regions 2 and 3. In FIG. 4A chain lines indicate the Fermi level and crosses and bars in circles indicate the concentration distribution of the holes and electrons. Under such conditions the impurity concentration of the substrate S is remarkedly lower than those of the regions $D_3$ and $D_4$, so that depletion layers expand into the substrate S to widths $d_3$ and $d_4$ around the third and fourth regions $D_3$ and $D_4$. Accordingly, when the forward voltage V impressed between the first and second electrode regions 1 and 2 is raised under such conditions, even if the holes are injected into the substrate S from the first electrode region 1, the injected holes are captured by the third electrode region 3. On the other hand, the potential distribution in the $\pi$ region around the second electrode region 2 is caused by the voltage $V_G$ impressed to the third electrode region 3 to render a reverse bias to the junction $J_2$ formed between the $\pi$ region and the second electrode region 2, so that substantially no electrons are injected into the substrate S from the second electrode region 2. Consequently, the carrier migration is hardly caused between the first and second electrode regions 1 and 2, and hence the impedance therebetween is great, that is, the current I hardly flows between the first and second electrode regions 1 and 2 as indicated by the region 5I of the curve 5.

Under such conditions, further increase in the voltage V causes an increase in the holes injected from the first electrode region 1, so that all the holes cannot be collected by the third electrode region 3 to raise the concentration of the holes in the substrate S. At the same time, the potential of the $\pi$ region around the second electrode region 2 also increases with the increase in the voltage V of the first electrode region 1 and the junction $J_2$ is biased in a forward direction, so that electrons are injected into the substrate S from the second electrode region 2 so as to balance the concentration of the electrons with that of the holes based upon the condition of neutralization of space charges. As a result of this, conductivity modulation is caused to decrease the impedance between the first and second electrode regions 1 and 2, thus initiating flow of a great current as indicated by the region 5II of the curve 5. In this case, the influence of the hole capturing effect is great in the area adjoining the junction $J_3$ of the third electrode region 3, and accordingly the concentration of the holes is of such a gradient as to become lower as the junction $J_3$ is approached. Meanwhile, the electrons tend to diffuse into the region $D_3$ of the third electrode region 3 to have a concentration gradient corresponding to that of the holes based upon the condition of neutralization of space charges but the junction $J_3$ serves as a barrier to the electrons, so that the electrons cannot migrate into the region $D_3$. Therefore, an electron drift current is caused which is equal to but opposite in direction to a diffusion current. In order to produce the drift current, there must be generated in the $\pi$ region the so-called built-in field which is clockwise in FIG. 4A. Since this field is produced in a direction to decrease the reverse bias impressed to the junction $J_3$ as indicated by broken lines in FIG. 4A, the depletion layer of the junction $J_3$ shrinks to reduce its initial width $d_3$ to $d_3'$. At the same time, there is produced a concentration gradient such that the concentration of the electrons becomes lower as the junction $J_4$ of the fourth electrode region 4 is approached, since the electron capturing effect is great near the junction $J_4$. Accordingly, the holes tend to diffuse into the region $D_4$ of the fourth electrode region 4 to have such a concentration gradient as to become lower as the junction $J_4$ is approached corresponding to the concentration gradient of the electrons based upon the condition of neutralization of space charges but the junction $J_4$ serves as a barrier to the holes, and hence the holes cannot diffuse into the region $D_4$. Consequently, a hole drift current is to be caused which is equal to but opposite in direction to the diffusion current. To allow generation of this drift current, there must be produced in the $\pi$ region of the substrate S a built-in field which is clockwise in FIG. 4A and this field is produced in a direction to decrease the reverse bias of the junction $J_4$, so that the depletion layer shrinks to reduce its initial width $d_4$ to $d_4'$.

When the depletion layers of the third and fourth junctions $J_3$ and $J_4$ have thus shrunk, the effects of capturing the holes and electrons injected from the first and second electrode regions 1 and 2 are decreased. Therefore, the concentration gradients of the holes and electrons in the $\pi$ region are further increased and the shrinkage of the depletion layers of the junctions $J_3$ and $J_4$ becomes remarkable. With such a positive feedback operation, the semiconductor circuit presents a negative resistance characteristic such as indicated by the region 5N of the curve 5.

When the depletion regions of the junction $J_3$ and $J_4$ have shrunk enough to almost remove their carrier capturing effect, the third and fourth electrode regions 3 and 4 may be regarded as being substantially not present, in which case the semiconductor circuit exhibits a characteristic such as indicated by the region 5III of the curve 5 which is the characteristic of a double-injection type diode employing the first and second electrode regions 1 and 2.

With an increase in the negative voltage impressed to the third electrode region 3, the initial expansion of the depletion layer of the junction $J_3$ increases, so that conductivity modulation is difficult to occur and the negative resistance characteristic becomes difficult to be produced unless a greater current is caused to flow, as indicated by curves 6 and 7.

Figure 4B:
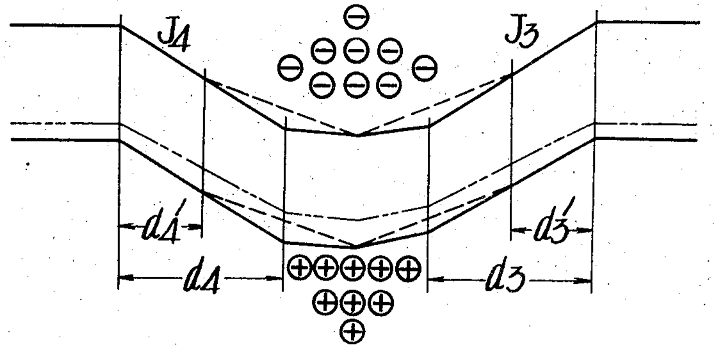

The foregoing description made in connection with FIG. 4A has been given of the negative resistance semiconductor circuit SR of this invention. In the event that the regions $D_3$ and $D_4$ of the third and fourth electrode regions 3 and 4 are both P-type regions for capturing the holes as depicted in FIG. 2, the energy band construction along the alignment line of the third and fourth electrode regions 3 and 4 crossing the current path LM between the first and second electrode regions 1 and 2 is such as indicated by solid lines in FIG. 4B. With an increase in the voltage V, the semiconductor circuit SR exhibits the characteristic indicated by the region 5I of the curve 5 as previously described in this case, too, since the carrier concentration in the $\pi$ region is held low at first by the capturing effect with the junctions $J_3$ and $J_4$. With the voltage V being further raised, the carrier concentration in the $\pi$ region is increased as above described to decrease the impedance between the first and second electrode regions 1 and 2, thus providing such a characteristic as indicated by the region 5II of the curve 5. In this case, the concentration of the holes in the vicinity of the junctions $J_3$ and $J_4$ is decreased by capturing the holes with the junction $J_3$ and $J_4$, so that such a concentration gradient as indicated by crosses in circles is resulted. As a result of this, a built-in field is similarly produced as previously described and the energy band construction varies as indicated by broken lines and the depletion layers of the junctions $J_3$ and $J_4$ shrink to reduce their initial widths $d_3$ and $d_4$ to $d_3'$ and $d_4'$ to decrease their carrier capturing effects to cause an increase in the concentrations of the electrons and holes, by which the depletion layers are shrunk in a positive feedback manner as is the case with the circuit SR of the construction of FIG. 1 to provide characteristics such as indicated by the regions 5N and 5III of the curve 5.

Although the foregoing description has been made in connection with the case where a negative voltage is impressed to the third electrode region 3, the voltage used need not always be limited specifically to the negative one so long as it may apply a reverse bias to the junction $J_3$ of the third electrode region 3. For example, when the voltage of the power source E is zero volt, namely when the second and third electrode regions 2 and 3 are shorted, a reverse bias is impressed to the third electrode region 3 essentially, and accordingly the negative resistance characteristic is exhibited.

In the examples of FIGS. 1 and 2 the power source E is connected between the second and third electrode regions 2 and 3 but the power source E may be connected between the first and third electrode regions 1 and 3 in such a manner that the positive electrode of the power source is connected to the first electrode region 1.

Figure 5:
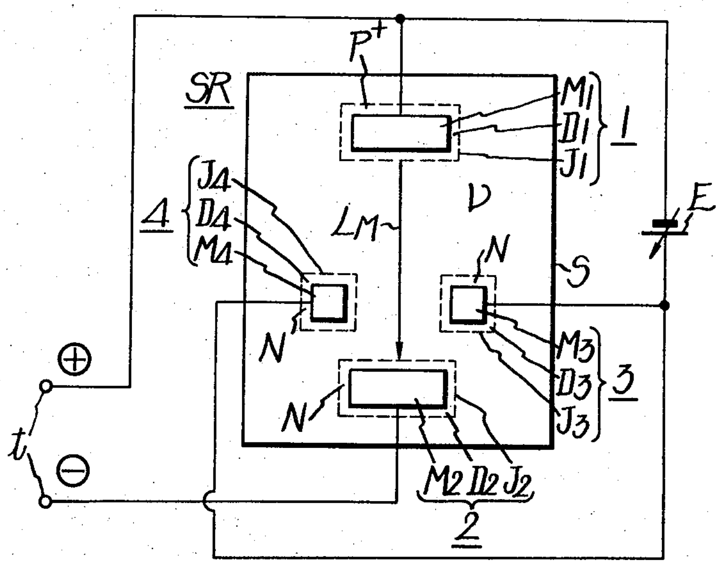
FIGS. 5 and 6 are connection diagrams, similar to FIGS. 1 and 2, showing modified forms of the negative resistance semiconductor circuit of this invention.

Further, in the examples of FIGS. 1 and 2 the third electrode region 3 serves to capture the holes injected from the first electrode region 1 but the third electrode region 3 may be adapted to capture the electrons injected from the second electrode region 2 as shown in FIG. 5. In FIG. 5 the fourth electrode region 4 also serves to capture the electrons, in which case, too, a similar negative resistance characteristic is presented. In this case the substrate S may be formed of a low impurity concentration N-type, namely $\nu$-type semiconductor. The operation of the semiconductor circuit in such a case can be understood from that of the semiconductor circuit SR of this invention of the construction depicted in FIG. 2 with the polarities being reversed, so that no description will be repeated for the sake of brevity.

Figure 6:
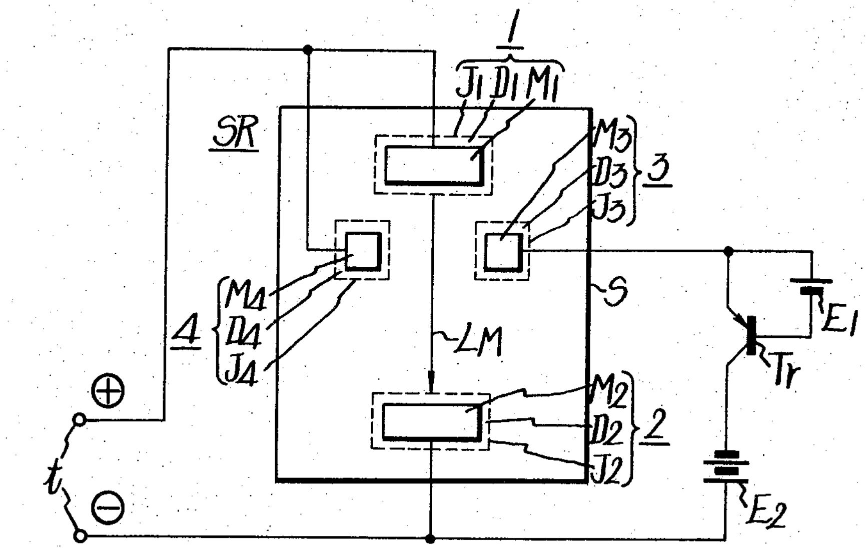

In the foregoing examples the negative resistance characteristic is obtained by applying the predetermined voltage $V_G$ to the third electrode region 3, namely by means of voltage control but the negative characteristic output con be derived from the terminals $t$ by applying a current to the third electrode region 3 or by the so-called current control. With reference to FIG. 6 a description will be given of the application of the current control to the semiconductor circuit SR of this invention shown in FIG. 1. Elements similar to those in FIG. 1 are marked with the similar reference numerals and characters and will not be described for the sake of brevity.

As depicted in FIG. 6, a transistor Tr serving as a constant current source is connected between the third and second electrode regions 3 and 2. The voltage of the power source $E_1$ connected between the base and the emitter of the transistor *Tr* or the power source $E_2$ connected to the collector of the transistor Tr is changed to thereby vary the current flowing in the third electrode region 3. A negative resistance characteristic such as indicated by a curve 8 in FIG. 7 appears between the forward voltage V making the first electrode region 1 positive relative to the second electrode region 2 and the current I.

The operation for controlling with the current flowing in the third electrode region 3 is considered to result from the following phenomenon. In this case, too, when the third electrode region 3 is held in the reverse bias condition a depletion layer is formed around the electrode region 3, so that the holes injected from the first electrode region 1 are almost captured by the third electrode 3 in the area of the voltage V being low as in the case with the voltage control. Accordingly, the characteristic curve presents the first stable region 8I shown in FIG. 7.

However, a further increase in the voltage V raises the concentrations of the electrons and holes as previously described. As a result of this, conductivity modulation is caused and the impedance between the first and second electrode regions 1 and 2 is lowered to thereby increase the current flowing therebetween. Thus, the characteristic curve shifts to the second stable region 8II shown in FIG. 7.

While, concentration gradients of the electrons and holes are formed between the third and fourth electrode regions in the same manner as previously described and by the built-in fields due to these concentration gradients, the depletion layers around the third and fourth electrode regions 3 and 4 are shrinked. In this case, the current *Ic* shunted from the first electrode region 1 to the third electrode region 3 is given by $Ic = \alpha I$ ($\alpha$ being a shunting ratio) and $\alpha$ decreases with the shrinkage of the depletion layer but the ratio of increase of I is greater than the ratio of decrease of $\alpha$, so that *Ic* increases. The current *Ic*, thus, tends to increase but since the constant-current source is connected to the third electrode region 3 and serves to make the current *Ic* constant, the depletion layer around the third electrode region 3 greatly shrinks. Thus, the current path LM between the first and second electrode regions 1 and 2 is hardly effected by the third and fourth electrode regions 3 and 4, especially by the third electrode region 3 and the characteristic shifts to the third stable region 8III through the negative resistance region 8N.

In this case, the potential of the third electrode region 3 is caused to approach that of the $\pi$ region around the region 3 due to the shrinkage of the depletion layer around the third electrode region 3. The junction $J_3$ of the third electrode region 3 extends along the current path LM between the first and second electrode regions 1 and 2 in the $\pi$ region, so that the portion of the junction $J_3$ opposing to the second electrode region 2 is biased in the forward direction. The holes flow into the $\pi$ region from the portion biased in the forward direction. Namely, the holes injected from the first electrode region 1 flow into the third electrode region 3 and flows out therefrom into the $\pi$ region. Accordingly, in the event of the current control, too, conductivity modulation becomes difficult to occur with an increase in the value of the predetermined current Ic flowing in the third electrode region 3, so that the negative resistance characteristic varies as indicated by curves 9 and 10 with the current *Ic* but the characteristic in the third stable region does not change.

Although the foregoing description has been given of the cases of the voltage control and current control separately, it is also possible to effect the voltage control and current control simultaneously by connecting a resistor in series to the power source E in FIG. 1, though not shown, and by selecting the resistance value of the resistor and the voltage of the power source E.

In the foregoing examples, the power source E or the transistor Tr serving as a constant-current source is connected only to the third electrode region 3 but the power source E or the transistor *Tr* may be connected to the fourth electrode region 4.

Figure 8:
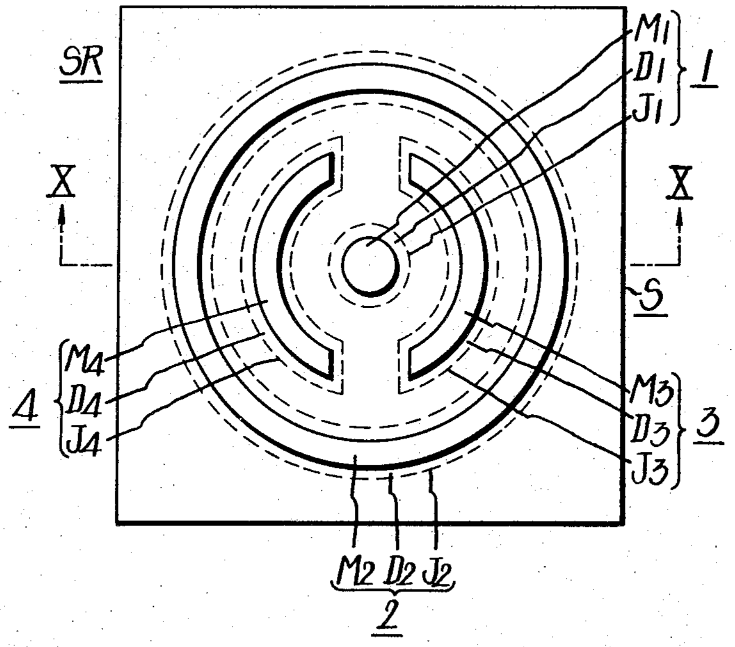
FIGS. 8 and 9 are respectively an enlarged plan view of one example of a semiconductor device employed in the circuit of this invention and an enlarged cross-sectional view taken on the line X—X in FIG. 8.
Figure 9:
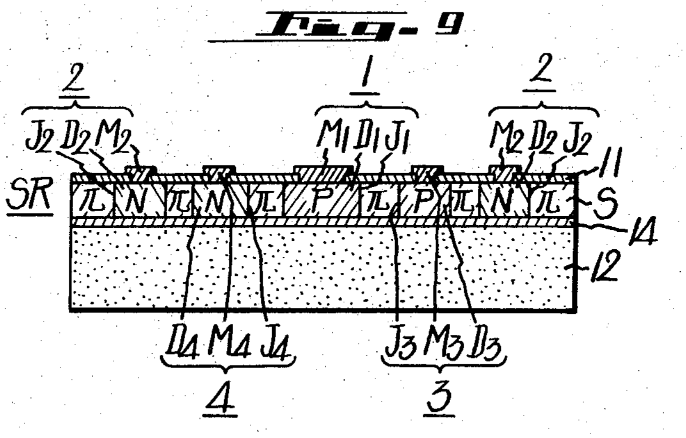

The semiconductor circuit SR of this invention may be formed in the following manner. Namely, as shown in FIGS. 8 and 9, arc-shaped third and fourth electrode regions 3 and 4 are disposed on the substrate S concentrically about the first electrode region 1 and the second electrode region 2 of a circular configuration is disposed on the outside of the third and fourth electrode regions 3 and 4. Further, the substrate S is preferred to be sufficiently thin and the regions $D_1$ and $D_2$ of the first and second electrode regions 1 and 2 are preferred to be formed to a thickness equal to that of the substrate S. In the illustrated example, the thicknesses of the regions $D_3$ and $D_4$ of the third and fourth electrode regions 3 and 4 are also selected equal to that of the substrate S. Reference numeral 11 indicates an insulating layer as of silicon dioxide covering the surface of the substrate S and, in practice, the regions $D_1$ to $D_4$ are formed by selective diffusion through the insulating layer 11 used as a mask. Further, the insulating layer 11 has formed therein windows, through which electrodes $M_1$ to $M_4$ are respectively deposited on the regions $D_1$ to $D_4$ in an ohmic manner.

Figure 10A:
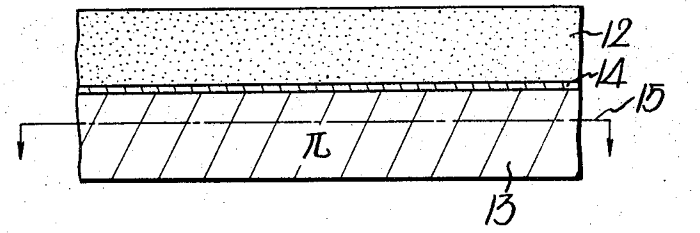
FIGS. 10A and 10B show process diagrams of one example of a method of making the semiconductor device.
Figure 10B:
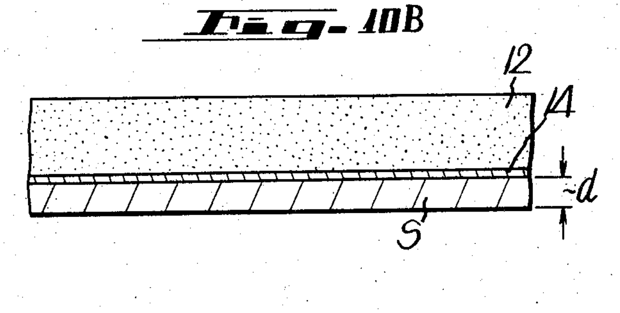

In the event that the substrate S is very thin, the substrate S has no sufficient mechanical strength, and accordingly a reinforcement layer 12 as of polycrystalline semiconductor is attached to the back of the substrate S. The substrate S having such a reinforcement layer 12 may be obtained in the following manner. Namely, a monocrystalline semiconductor, for example, a monocrystalline silicon substrate 13 is prepared which can ultimately serve as the substrate S but is thick enough to retain its mechanical strength, and then a layer 14 is formed which is capable of acting as a seed for polycrystalline development, as shown in FIG. 10A. THe seeding layer 14 may be formed by vapor deposition of an amorphous layer or a polycrystalline layer as of silicon dioxide or may be formed by roughening one surface of the substrate 13 by sand blasting method to disturb the crystal lattice therein. Then, the reinforcement layer 12 is formed by vapor growth of a polycrystalline semiconductor as of silicon on the seeding layer 14. Thereafter, the substrate 13 is selectively removed by mechanical or chemical grinding or like method on the opposite side from the reinforcement layer 12 as indicated by a chain line in FIG. 10A, thus providing a substrate S having a sufficiently small thickness *d* as shown in FIG. 10B.

Next, the silicon dioxide layer 11 is formed on the substrate S, after which the semiconductor circuit SR of this invention is produced in the manner previously described with FIGS. 8 and 9.

As will be seen from the foregoing, the impurity concentration of the substrate S is required to be such that when the depletion layers around the third and fourth electrode regions 3 and 4 have shrinked the collector effect of the carriers is lowered and, in other words, the collector saturation characteristics of the junctions $J_2$ and $J_4$ are desired to be poor. Accordingly, the resistivity of the substrate S is required to be high and its concentration may be less than $10^{15}$ atoms/cm$^3$ as previously mentioned.

It has been found that when a $\pi$-type silicon substrate S is used and the regions $D_1$ and $D_3$ of the first and third electrode regions 1 and 3 in the example of FIG. 1 and the regions $D_1$, $D_2$ and $D_4$ of the electrode regions 1, 2 and 4 in the example of FIG. 2 are sufficiently higher in impurity concentration than the substrate S, the negative resistance characteristic is exhibited so long as the resistivity of the substrate S is greater than 10 to 15 ohm cm.

In connection with the example of FIG. 5, too, it has been found that when the impurity concentration of the semiconductor region $D_1$ of the first electrode region 1 is very high and when the insulating layer 11 of $SiO_2$, $Si_3N_4$, SiN or the like is deposited on the substrate S formed of silicon, namely when the surface level of the substrate S is low, an N-channel is formed under the insulating layer 11, and hence that the substrate S may be formed of a $\pi$-type semiconductor having an impurity concentration of less than $10^{15}$ atoms/cm$^3$.

Figure 7:
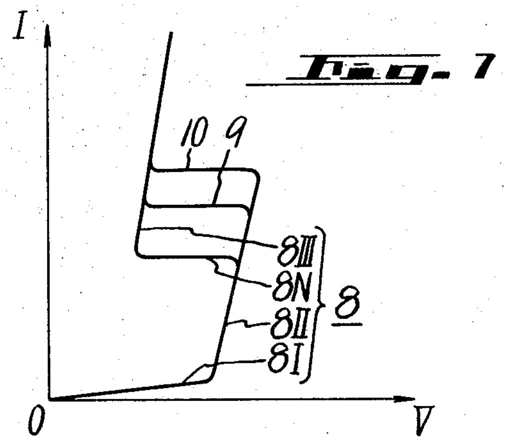
FIG. 7 is a graph illustrating the voltage-current characteristic of the semiconductor circuit of FIG. 6.

As previously described with FIGS. 3 and 7, the semiconductor circuit SR of this invention is featured in the prominant existence of the second stable regions 5II or 8II in its characteristic. With the presence of such a stable region, in the case of constructing a bistable circuit adapted such that its characteristic curve intersects with a load line at the third stable region 5III or 8III and the second stable region 5II or 8II, the gradient of the load line, that is, the value of the load can be selected with tolerance. Thus, this invention is advantageous in the design of circuits and hence is useful in practice.

It will be apparent that many modifications and variations may be effected without departing from the scope of the novel concepts of this invention.

I claim as my invention

1. A negative impedance circuit comprising: a semiconductor device having a substrate; first, second, third and fourth impurity concentration regions, each forming a separate junction with said substrate, said first and second regions being of opposite conductivity type to inject carriers of opposite polarity into said substrate and being spaced from each other by a distance greater than the diffusion distances of said carriers; means biasing said first and second regions to cause them to inject carriers of opposite polarity into said substrate to form a main current path between said first and second regions, said third and fourth regions being disposed on opposite sides of a substantially main part of said current path; and means for reversely biasing the junctions formed between said substrate and said third and fourth regions to produce a negative impedance effect between said first and second regions, wherein said third and fourth regions are of opposite conductivity type.

2. A negative impedance circuit comprising: a semiconductor device having a substrate; first, second, third and fourth impurity concentration regions, each forming a separate junction with said substrate, said first and second regions being of opposite conductivity type to inject carriers of opposite polarity into said substrate and being spaced from each other by a distance greater than the diffusion distances of said carriers; means biasing said first and second regions to cause them to inject carriers of opposite polarity into said substrate to form a main current path between said first and second regions, said third and fourth regions being disposed on opposite sides of a substantially main part of said current path; and means for reversely biasing the junctions formed between said substrate and said third and fourth regions to produce a negative impedance effect between said first and second regions, wherein said substrate is $\pi$-type and said first and second regions are respectively P- and N-types, and wherein said third and fourth regions are P-type and N-type respectively and said reversely biasing means includes a voltage source connected between said second and third regions which applies a negative voltage to the third region and a connection point between said first and fourth regions.

* * * * *